United States Patent [19]

Neely

[11] Patent Number: 4,888,209

[45] Date of Patent: Dec. 19, 1989

[54] CATALYTIC PROCESS AND SYSTEMS

[75] Inventor: James W. Neely, Dresher, Pa.

[73] Assignee: Rohm and Haas Company, Philadelphia, Pa.

[21] Appl. No.: 109,643

[22] Filed: Dec. 2, 1987

Related U.S. Application Data

[60] Division of Ser. No. 833,423, Feb. 21, 1986, Pat. No. 4,719,145, which is a continuation of Ser. No. 536,925, Sep. 28, 1983, abandoned.

[51] Int. Cl.$^4$ .............................................. B05D 5/12
[52] U.S. Cl. ........................................ 427/97; 427/96; 427/98
[58] Field of Search .............................. 427/96, 97, 98

[56] References Cited

U.S. PATENT DOCUMENTS

| | | | |
|---|---|---|---|
| 4,188,415 | 2/1980 | Takahashi | 427/97 |
| 4,252,677 | 2/1981 | Smith | 502/159 |
| 4,317,856 | 3/1982 | Huthwelker | 427/97 |
| 4,478,883 | 10/1984 | Bupp | 427/97 |
| 4,719,145 | 1/1988 | Neely | 427/305 |

Primary Examiner—Shrive Beck
Assistant Examiner—Vi Duong Dang
Attorney, Agent, or Firm—Marc S. Adler

[57] ABSTRACT

A process is provided for conducting or catalyzing a chemical reaction on a surface by depositing on the surface an adherent monolayer of positively charged polymer particles containing an active agent distributed throughout the polymer and contacting the deposited adherent monolayer with a suitable reactant. The positively charged polymer particles have diameters of less than about 3 micrometers and preferably less than 1 micrometer. The polymer particles are suspended in water to form an aqueous colloidal dispersion. The dispersion is useful as a stable catalyst system and particularly useful for complete electroless deposition of a conductive metal on printed circuit board surfaces and the walls of throughholes formed therein.

13 Claims, 5 Drawing Sheets

CATALYTIC PROCESS AND SYSTEMS

BACKGROUND OF THE INVENTION

This invention relates to a process for catalyzing or conducting a chemical reaction on a surface and the colloidal dispersion or solution used in the process. More particularly, the invention relates to a stable aqueous colloidal dispersion of positively charged polymer particles having diameters less than 3 micrometers, containing an active agent distributed throughout the polymer, and the use of the stable dispersion for depositing an adherent monolayer of the positively charged polymers on a surface followed by contacting the deposited monolayer with a suitable reactant. The catalytically active or reactive agent distributed throughout the polymers will be referred to hereinafter simply as an "active agent." The term polymer "particles" refers herein to water insoluble polymers containing an active agent distributed throughout as well as to water soluble polymers which become insoluble when an active agent is distributed throughout such soluble polymers. The polymers, whether initially soluble or insoluble in water, containing an active agent distributed throughout will be referred to hereinafter as a "catalyst" system. The catalyst system is particularly useful for catalyzing the complete electroless deposition of a conductive metal layer on the surface of a printed circuit board and the walls of the through-holes formed therein. The term "monolayer" as used herein refers to a surface coating or layer of the positively charged soluble polymer of one molecule thickness or to a layer of the positively charged polymer particles, containing an active agent, of one particle thickness. Monolayer includes both a partial or a complete coating of the surface by the adherent polymer.

Electroless deposition refers to the chemical deposition of a metal coating on a conductive, non-conductive, or semi-conductive substrate in the absence of an external electric source. Electroless deposition is used to apply metal coatings to: plastics, referred to as plating-on-plastics; metals, to provide corrosion and/or abrasion resistance; and is the preferred commercial method for depositing an adherent surface coating or predetermined pattern of a conductive metal, such as copper, on a dielectric substrate as in the manufacture of printed circuit boards. The key to accomplishing electroless deposition is to provide catalytic nucleating centers on the substrate at which centers or sites the reduction of metal ions to elemental metal and the deposition of the metal on the substrate occurs.

In the manufacture of printed circuit boards, a plastic panel, such as an epoxy/glass laminate, is used as the substrate. The substrate may have a metal foil, such as copper foil, laminated onto one or both of its surfaces, forming a metal cladding. When both surfaces are to be used to form a circuit thereon, connections are provided between the surfaces as by drilling or punching holes through the substrate at desired locations. In order to provide a continuous electrical path on and between the surfaces, the walls of the through-holes and the substrate surfaces must be made conductive as by electroless deposition. Following electroless deposition on the substrate surfaces and through-hole walls, the deposited metal layer is typically built up to an acceptable thickness for an electrical circuit, for example, by electroplating followed by photoresist imaging of the circuit.

Certain common processing steps are utilized in all conventional electroless deposition methods. The substrate surface must be carefully cleaned, etched, and rinsed. The substrate must also be conditioned for the deposition of catalytic nucleating sites. The conditioned substrate is then treated with a catalyst system for the deposition of catalytic nucleating sites on the substrate surface. The catalytic substrate is then accelerated to remove protective colloids which are typically used with the catalyst system to maintain the stability of the catalyst system. Electroless deposition of the desired conductive metal, such as copper or nickel, is then conducted by immersing the catalytic substrate in a solution of a salt of the electroless metal and a reducing agent. The electroless deposition then proceeds autocatalytically.

Since it is necessary to deposit a complete electroless metal layer on the substrate surface and through-hole walls, attempts have been made to provide a sufficient number of active catalytic nucleating sites thereon using stable conditioning systems and catalyst systems, while at the same time attempting to maximize the thickness of the electroless metal layer, reducing the process steps and time involved, minimizing the loss and deactivation of the catalytic metal, and obtaining reproducible results, and the like. While many improvements have been made over the past twenty years in these areas, because of increased quality requirements, such as for complete through-hole plating, the advent of multilayer printed circuits and improved techniques for examining the coverage of the electroless deposition on substrate surfaces and throughhole walls, it has been found that the conventional conditioning and catalyst systems are deficient for today's increasingly stringent requirements. One example of such a deficiency is the determination that incomplete throughhole wall coverage is obtained with conventional electroless deposition methods, and furthermore that incomplete through-hole wall deposition promotes outgassing, or the permeation of volatile materials from behind the deposited metal into the through-holes, resulting in blow-holes in the electroless metal layer during soldering of component leads to the circuit.

The present invention is directed to an improved electroless deposition process and catalyst system which offers significant improvements over conventional catalyst systems, especially in providing complete coverage of the substrate surface and through-hole walls with an adherent, thicker electroless metal layer while reducing the process steps and catalyst losses, among other advantages.

DESCRIPTION OF THE PRIOR ART

An early method for metallizing non-metallic bodies was described in U.S. Pat. No. 2,430,581. This method utilized a solution of a salt of the metal to be deposited, such as nickel acetate, and reducing agents. The catalyst was a solution of a soluble salt of a platinum group metal, such as palladium chloride. A protective colloid, such as polyvinyl alcohol, was suggested to prevent premature precipitation of palladium metal from the unstable catalyst solution. The method resulted in spontaneous plating of the reaction vessel and was uneconomical.

An improved two-step method utilizing a substrate sensitizing solution of a stannous salt, such as stannous chloride in hydrochloric acid, and a catalyst solution, such as palladium chloride in hydrochloric acid, was then introduced. Stannous ions acted to reduce palladium ions to their zero valence for deposition of insoluble palladium metal on the substrate. Inadequate bonds between the electroless metal and the metal cladding and dielectric substrate resulted, however, and the metal deposited on the cladding had to be removed as by sanding or buffing. This was expensive, time consuming, and often ruined the laminate. Poor bonding and subsequent removal also resulted in inadequate bonds at the cladding-through-hole wall boundary. The method often yielded non-uniform and nonreproducible results, and the catalyst was subject to sudden losses in activity requiring frequent catalyst replacement.

In 1961, U.S. Pat. No. 3,011,920 to C. R. Shipley, Jr., disclosed an improved single-step catalyst. A substrate sensitizer containing stannous chloride was combined with palladium chloride to form a colloidal dispersion of a catalytic metal. Stannous chloride in the combined system also acted as a protective colloid for the catalyst, stabilizing the catalyst against agglomeration and premature precipitation. Excess stannous ions relative to palladium ions were necessary to stabilize the catalyst. An optional acceleration step was suggested to remove the protective colloid from the catalyst metal after the catalyst metal had been deposited on the substrate and prior to electroless deposition. The acceleration step using an alkaline material or preferably a dilute acid, such as hydrochloric acid, was taught as leading to stronger adsorption and bonding of the electroless metal to the substrate. The low pH of the accelerator, pH below about 1, was taught to be necessary to maintain the catalyst stability. U.S. Pat. No. 3,562,038 described an attempt to improve the adhesion of the stannic acid/palladium colloid-catalyst to substrates by first selectively roughening or chemically treating the substrate. The technique was described as being useful to deposit a predetermined electroless pattern on the substrate. Adhesive coatings containing conventional size ion exchange resins having adsorption and/or retention properties for the catalyst which differed from those for the substrate were first applied to the substrate. Cationic exchange resins were taught to repell positively charged colloidal catalyst particles leaving the surface low in colloid concentration, while anion exchange resins attracted positive colloidal catalyst particles resulting in a higher concentration of the colloid catalyst. U.S. Pat. No. 3,672,938 was also directed to a stannous-palladium catalyst in a true solution rather than in a colloidal dispersion as in U.S. Pat. No. 3,011,920.

When the acceleration step was not utilized with these single-step catalysts, the electroless deposition achieved was inadequate. The acceleration step removed most of the tin from the catalyst. The absence of the acceleration step resulted in slow initiation of electroless deposition in the electroless bath since the unremoved tin acted to inhibit the action of the catalyst for electroless deposition. In addition, in the absence of the acceleration step, a significant amount of tin was carried-over into the electroless bath, which also reduced the quality of the electroless plating as well as the plating rate. Accordingly, attempts were made to formulate other protective colloids for the palladium catalysts and to increase the pH of the catalyst system. U.S. Pat. No. 3,681,257 utilized a protective colloid formed from hydrolyzed egg albumen and lithium hydroxide treated with acetic acid. The colloid was unstable, difficult to prepare, and time consuming to use commercially. Other water soluble protective polymers were also suggested, as in Japanese Patent J4 9063623 to Hitachi Ltd., but they also did not meet with commercial acceptance. U.S. Pat. No. 3,900,320 utilized a pre-plating, non-aqueous solution containing the catalytic metal salt, a polymeric binder, and a solvent. Since the pre-plate solution could be applied directly to the substrate without special cleaning or etching, the object of the invention was to reduce the process steps of the process and provide better coverage of the substrate. The pre-plate solution was then dried and cured as by pyrolyzing the coating prior to electroless deposition. This technique was unsuitable as it introduced a second permanent dielectric layer, formed from the polymeric binder, between the cladding and the electroless metal leading to poor electricial conductivity. In addition, pyrolysis of the coating at high temperature tended to damage the substrate. A similar attempt was disclosed in U.S. Pat. No. 4,253,875 utilizing a catalytic lacquer; however, the lacquer was not a stable dispersion and the thickness of the lacquer was unsuitable for complete through-hole wall deposition. Furthermore, the lacquer also introduced a second dielectric layer as in U.S. Pat. No. 3,900,320. U.S. Pat. No. 3,347,724 utilized a catalytic ink with an adhesive resin base and dispersed catalytic agents. The resin binder acted to insulate the catalyst particles from each other resulting in slow and non-uniform electroless deposition.

PH below about 1 attacks the substrates, especially plastic substrates, and plastic racks used to carry substrates through the process. U.S. Pat. No. 3,904,792 attempted to alleviate the low pH problem by replacing the hydrochloric acid with additional "extraneous" halide ions other than iodine. This solution was only a compromise since, in general, it is highly desirable to process electronic devices with compositions of low electrolyte concentrations. (See *Technical Report AFML-TR*-78-203 (1978), Air Force Materials Laboratory, Wright-Patterson Air Force Base.) U.S. Pat. No. 4,001,470 replaced the protective colloid with gum arabic or gelatin and replaced the hydrochloric acid accelerator with one or more carboxylic acids. U.S. Pat. No. 4,004,051 eliminated the acceleration step by incorporating an organic suspending agent, such as polymerized alkyl naphthalene sulfonic acid and its salts, and a noncomplexing reducing agent, such as dimethylamine borane and sodium borohydride with the catalyst metal salt solution. While these systems allowed for the use of an increased pH of about 3.5, the resulting electroless deposition achieved was still inadequate.

The disadvantages of tin-palladium catalysts for electroless deposition of through-hole walls is discussed in *Through-Hole Plating Without Palladium Catalysts*, D. A. Luke, Transactions of the Institute for Metal Finishing, Vol. 60, (1982), pp. 97–101. Luke points to free acid attack on the copper cladding as limiting the life of palladium catalysts, corrosion problems caused by free acid on oxide coated copper inter-layers of multi-layer boards, and the formation of active palladium black smut, as being problems inherent with the tin-palladium catalyst systems. The palladium smut is disclosed as causing instability in the electroless bath and resulting in poor electroless adhesion if not scrubbed away. The article discusses the need to condition the substrate surface to promote coverage. Since substrate surfaces are typically negatively charged, he maintains that, when using stannic acid-palladium catalysts, it is necessary to partially neutralize the surface as by immersion in a cleaner containing a cationic wetting agent, such as quaternary ammonium salt to achieve adhesion. However, he points out that even this conditioning may not be sufficient to obtain complete coverage. Luke proposes the use of an aqueous colloidal copper activator with a protective organic colloid and a reducing agent in place of tin-palladium catalysts. He suggests that, for preparing conductive surfaces for catalytic deposition with this colloidal copper, the substrate should be subjected to low voltage for a few seconds to produce nascent hydrogen at the substrate surface to improve subsequent electroless coverage for epoxy-glass, polyimide, and PTFE substrates. This voltage sensitization would not, however, be suitable to condition the non-conductive through-hole walls.

While it is known to load noble metal salts onto conventional size ion exchange resin beads and to reduce the salt to a zero valence metal, as in U.S. Pat. No. 3,578,609 and U.S. Pat. No. 4,330,679, and to grind the resin, or to entrap noble metals in amorphous cross-linked, pore-free polymer gels to form films, as in U.S. Pat. No. 3,997,472, or to form colloidal dispersions of active metals with functionalized vinyl polymers, as in U.S. Pat. Nos. 4,252,676; 4,252,677; and 4,252,678, or to deposit noble metals within porous refractory supports, such as activated carbon, as in U.S. Pat. No. 4,235,748, none of these systems has found application for depositing an adherent monolayer of positively charged polymer particles having particle size diameters less than 3 micrometers and containing an active agent distributed throughout for a rapid and complete chemical reaction on a surface, such as for the electroless deposition of a conductive metal on the entire surface of the through-hole walls formed in a printed circuit board.

Furthermore, recent advances in synthetic polymer-noble metal catalyst colloids have focused on the ability to selectively hydrogenate diolefins to monolefins and not for depositing positively charged, submicron sized polymer particles as an adherent monolayer on negatively charged surfaces for a chemical reaction, such as for complete electroless deposition. These advances are described in: *A Polyion Complex —Supported Palladium Catalyst for Selective Hydrogenation of Conjugated Diolefins to Monolefins*, Nakamura and Hirai, *Chemistry Letters*, pp. 1197–1202 (1976) (colloidal palladium supported on polyion complex of polyacrylic acid and polyethylene imine); *Selective Hydrogenation of Conjugated Doolefins to Monolefins Catalyzed by a Polymer-Palladium Complex*, Nakamura and Hirai, *Chemistry Letters*, pp. 165–168 (1976) (palladium chloride complexed with conventional styrene-divinyl benzene copolymer with iminodiacetic acid groups); and *Formation and Catalytic Functionality of Synthetic Polymer-Noble Metal Colloid*, Hirai, *J. Macromol. Sci. Chem.*, A 13 (5), pp. 633–649 (1979) (colloidal dispersion of noble metals in polyvinyl pyrrolidone). Accordingly, the prior art has recognized the need to improve upon the conventional methods for catalyzing substrate surfaces and through-hole walls to achieve better electroless metal coverage but has not solved all the process problems inherent in the use of conventional catalyst systems. In addition, recent advances in polymer metal catalysts have not been utilized to develop improved processes for catalyzing conductive and non-conductive substrates and through-hole walls formed therein, such as for complete electroless metal coverage.

It is an object of the present invention to provide an improved process for conducting or catalyzing a complete chemical reaction on a surface by depositing a strongly adherent monolayer of polymers, having an active agent distributed throughout the polymers, the polymer particles having diameters less than 3 micrometers, and contacting the deposited monolayer with a suitable reactant.

It is also an object of this invention to provide an improved process for complete electroless deposition on printed circuit board surfaces and through-hole walls with a catalyst system, and to a process that requires fewer processing steps and results in fewer processing difficulties than conventional catalyst systems.

It is a further object of this invention to use a stable, aqueous catalyst system of positively charged polymers containing a catalytic agent distributed throughout the polymers for catalyzing surfaces, the catalyst system being active over a wide range of pH's and being free of tin and other chemicals which could contaminate or adversely affect the reactants or the surfaces on which the catalyst system is deposited.

It is an additional object of the invention to provide a stable catalyst system useful for catalyzing surfaces by which the amount of the active agent deposited on the surface can be controlled relative to the deposited surface area so that the rate of the chemical reaction on the surface which the catalyst system initiates can be effectively regulated.

SUMMARY OF THE INVENTION

According to the invention, a process is provided for depositing a monolayer of positively charged soluble or insoluble polymers, containing an active agent distributed throughout the polymers, where the insoluble polymer particles containing the active agent have particle size diameters less than about three micrometers, on a surface, and contacting the deposited monolayer with one or more suitable reactants to conduct or catalyze a reaction on the surface. The monolayer is deposited on the surface by contacting the surface with a stable aqueous dispersion of the insoluble polymer particles containing an active agent distributed throughout the particles or with a solution of the soluble polymers containing an active agent distributed throughout the polymers.

DETAILED DESCRIPTION OF THE INVENTION

Figure 1:
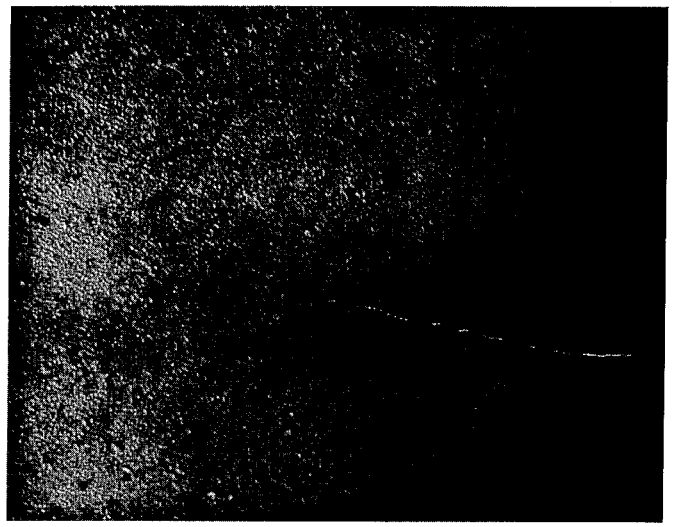
FIG. 1 is a photograph of a deposited monolayer of the catalyst particles on a glass microscope slide magnified seven hundred times.

I have found that aqueous dispersions of positively charged insoluble polymer particles having diameters of less than about 3 micrometers, and preferably less than 1 micrometer, loaded with active agents form a stable catalyst system The system is useful for initiating a controlled chemical reaction on surfaces by depositing an adherent monolayer of the polymer particles onto the surface, followed by contacting the deposited monolayer with one or more suitable chemical reactants.

A positively charged polymer or positively charged surface refers to any polymer or positively charged surface which possesses a functional group which is, or is capable of becoming, a cation (positive ion) in water. Each positive charge on the polymer is counterbalanced by a mobile anion (negative ion) in the polymer matrix to maintain electrical neutrality of the entire particle.

The invention results from the discovery that certain, positively charged, polymers, whether initially soluble or insoluble in water, having particle size diameters less than about 3 micrometers, can form an adherent monolayer on a wide variety of surfaces when the surfaces are in the presence of water. While it is believed that this strong adhesion is the result of an electrostatic interaction between the polymer and the surface, an exact understanding of the adhesion mechanism is not critical to the utility of the invention.

It is also possible to deposit the positively charged, soluble polymers on a charged surface as an adherent monolayer and then to contact this monolayer with one or more active agents.

Furthermore, it is also possible to contact the positively charged soluble polymers with one or more active agents to form an aqueous soluble catalyst system and to adherently deposit this catalyst system on charged surface for initiating a reaction thereon.

The extraordinary adhesion of the positively charged polymers on surfaces is useful for carrying active agents to the surfaces and for depositing these active agents onto surfaces. The strong adhesion of the polymer particles, containing the active agents, on the surface results in the creation of a high concentration of active agents on the surface. A monolayer of the polymer particles is formed on the surface as by simply dipping the surface into an aqueous dispersion of the polymer particles. Any surface reaction can be improved, or made to function, by employing the aqueous dispersion of the polymer particles containing a suitable active agent.

Submicrometer particle size, insoluble polymers useful in forming the catalyst system and in the process of the present invention include the copolymers described in U.S. Pat. No. 4,359,537 entitled "Emulsion Copolymer Anion Exchange Resins", the disclosure of which is incorporated herein by reference. These emulsion copolymers are essentially spherical, crosslinked copolymers formed from a major amount of monoethylenically unsaturated monomers or mixtures of such monomers, such as styrene and methacrylic acid esters, and minor amounts of polyethylenically unsaturated crosslinking monomers or mixtures of such monomers, such as divinylbenzene. The particle size diameter of the aqueous insoluble, crosslinked copolymers can range from about 0.01 to about 1.5 micrometers. Narrow distribution of submicron particle size copolymers, having diameters ranging from about 0.01 to about 0.5 micrometers, can also be prepared. These polymers having particle size diameters less than about one micrometer, preferably less than 0.5 micrometer, even more preferably less than about 0.3 micrometers, and most preferably about 0.1 micrometers, are especially useful in the practice of the present invention.

The crosslinked copolymer particles can be made positively charged by functionalizing the copolymer with a weak or a strong base. Functional groups that are ionizable to a cation in water and which can be used with the polymer particles include, but are not limited to, quaternary ammonium groups, tertiary amines, secondary amines, primary amines, and pyridines.

Strongly basic copolymers may be prepared, for example, by chloromethylating coagulated particles of the crosslinked styrenic copolymer with chloromethyl ether in the presence of a Lewis acid, such as aluminum chloride, and treating the resulting intermediate copolymer with a tertiary amine, such as trimethylamine, to form a quaternary amine chloride functional group. Alternatively, a strongly basic quaternary amine copolymer can be prepared by treating a crosslinked acrylic acid copolymer with a diamine containing both a tertiary amine group and a primary or secondary amine group, such as dimethylaminopropyl amine or di(3-dimethylaminopropyl)-amine, and quaternizing the resulting weakly basic resin with an alkyl halide, such as methyl chloride. Weakly basic copolymer resins may be prepared, for example, using the same method described above for strongly basic resins, except that, in the case of a styrenic resin, primary or secondary amines are employed instead of tertiary amines, and for acrylic ester copolymers the resin is not quaternized with an alkyl halide. As described in more detail below, I have found that the strongly basic cationic copolymers are more preferred in the practice of this invention at higher pH's than the weakly basic copolymers. While these crosslinked copolymers are insoluble in water they form stable colloidal dispersions or emulsions in water.

Certain non-crosslinked polymers are also suitable in the practice of the invention. These non-crosslinked polymers are soluble in water and form stable aqueous solutions. Particularly suitable non-crosslinked polymers include dimethylaminoethyl methacrylate polymer, quaternized with epichlorohydrin or ethylene oxide. Other positively charged soluble polymers or organic polyelectrolytes suitable in the practice of this invention include poly N,N-dimethyl-3,5-methylene piperidinium salt, polyethylene imine, polymers of dimethyl diallyl-ammonium salt, where the salt counterion can be any soluble anion such as a chloride ion, copolymers of dimethyl amine or monoethylamine and epichlorohydrin, and quaternized forms of the above copolymers, and modified natural organic polyelectrolytes such as guar gum treated with diethylaminoethylchloride hydrochloride. In addition, other polymers containing a basic moiety capable of forming a cation in water, such as tertiary amines typified by the following: trimethylamine, triethyl and tripropyl amines, dimethyl ethyl amine, diethyl cyclohexyl amine, tricyclohexylamine, triphenylamine, diphenyl ethyl amine, benzyldimethylamine, benzyl phenyl methyl amine, and the like including those listed on page D-168 and D-169 of the *Handbook of Chemistry and Physics*, Weast, 63rd Ed. (1982-83), can be used as a soluble polymer in the practice of the invention.

Active agents are distributed throughout the polymers utilizing the ion exchange properties of the polymers. The active agent, in anionic form, is ion exchanged, and optionally reduced, to form a uniform distribution of the active agent throughout the polymer matrix. This is accomplished by simply mixing an aqueous solution or colloidal dispersion of the soluble or insoluble polymers, respectively, with the active agent and optional reducing agent. In the case of an aqueous solution containing the soluble polymers, typically when the active agent becomes distributed throughout the polymer matrix and is reduced, a stable aqueous dispersion of polymer particles is formed. When the insoluble polymers are mixed with the active agents, the active agent also becomes distributed throughout the polymer matrix, and the colloidal dispersion remains stable.

Catalytically active agents which can be distributed throughout the polymers include a catalytic metal or salts thereof. The catalytic metals include the plantinum group of metals, including platinum, palladium, rhodium, rhenium, ruthenium, osmium, and iridium, and other metals or salts of such metals such as nickel, tin, copper, cobalt, iron, silver, gold, and mixtures thereof.

Any chemical, which is capable of reacting with a subsequently introduced reagent, can be distributed throughout the polymers to function as the active agent. These reactive agents include oxidizing agents and reducing agents, such as peroxides, boranes, aminoboranes, and chemicals containing oxidative and/or reductive functional groups.

In the preparation of an electroless deposition catalyst system, palladium is the preferred active agent. The chloride form of the polymer in aqueous solution or disperion is preferably mixed with palladium chloride powder. Palladium chloride forms a tetrachloropalladate ($PdCl_4^{-2}$) complex with the chloride ions associated with the functional groups distributed throughout the polymer matrix. Depending on the degree of catalytic loading desired, the ionic palladium will become associated with one or more functional groups distributed throughout the polymer matrix. The palladium ions are then optionally reduced to elemental metal (zero valence) using an appropriate reducing agent, such as a formaldehyde and sodium hydroxide solution. Upon the reduction of the ionic metal to the pure metal or zero valence state, the active catalyst metal remains distributed throughout the polymer matrix.

The active colloidal dispersions, formed by distributing an active agent throughout the insoluble or initially soluble polymers, remain stable after the reduction of the salt of the active agent without its precipitation from the dispersion. The concentration of the active agent in the dispersion can be regulated without affecting the stability of the dispersion. The concentration can be regulated by diluting the dispersion with water while maintaining the loading of active agent per unit weight of polymers constant. Conventional tin palladium catalyst systems are not stable upon dilution. If the concentration of the metals in such a conventional dispersion is reduced by dilution, coagulation of the metals from the dispersion would occur.

Examples 1 and 2 illustrate the synthesis of catalyst systems, that is, catalytically active aqueous dispersions, from strongly basic polymers which are initially insoluble or soluble, respectively, in water. The catalyst systems can be prepared as a concentrated dispersion with a desired loading of catalyst per gram of dry polymer, and such a system can be diluted with water to prepare a working, stable dispersion. Catalyst metal losses during processing, for example, losses resulting from drag out during electroless deposition, can be minimized by using as low a concentration of the catalyst agent as practical in the dispersion by diluting the catalyst system. Practical working dispersions refer to a catalyst or reactive system which can initiate the desired chemical reaction on the surface within a practical contact time between the dispersion and the surface.

Many substrates, when subjected to aqueous solutions, will form negatively charged surfaces. The cationic polymers of the stable aqueous solution or dispersion of the invention adhere, as by electrostatic forces, to the negatively charged surfaces. Since the polymers have like surface charges they are repelled from each other and are attracted equally to negatively charged surfaces. The polymers can thereby form a monolayer, of not more than one molecule or particle in thickness, on the surface. FIG. 1 illustrates a uniform monolayer of the polymer particles deposited on a glass microscope slide. The photograph was taken with seven hundred times magnification using a Zeiss Universal reflected light microscope and using a Nomarski Differential Interference Contrast Technique, which is sensitive to surface contours.

While the deposition of a complete monolayer of polymers containing an active agent is often preferred for the rapid and complete reaction on a surface, a partial monolayer coverage of the dispersion containing a lower concentration of active agent may often be adequate for effective surface reaction. In general, the formation of a complete monolayer on a surface is independent of the concentration of the active agent in the dispersion. Both concentrated and dilute dispersions will reach the same degree of monolayer coverage on a surface; however, dilute dispersions will require longer contact times and/or more effective agitation before complete monolayer coverage occurs than with a more concentrated dispersion. Accordingly, in determining the optimum concentration of the active agent, the contact time, active agent losses, minimization or prevention of over-catalyzation, that is, deposition of more catalyst on the surface than is necessary, and the desired degree of uniformity of reaction product on the surface must be taken into account. The concentration of active agent in the dispersion or solution which results in a complete monolayer on the surface in the shortest contact time sets the upper limit for the active agent concentration. In order to achieve a complete monolayer of the insoluble polymer particles containing the active agent, it should be noted that it is not necessary that all the polymer particles have the same particle size diameter. Preferably, however, the most uniform monolayer will be formed when all the polymer particles are of about the same diameter.

Any surface possessing a negative charge in the presence of water can be coated with an adherent monolayer of the positively charged polymers. I have also found that surfaces which possess a net positive surface charge in water, such as copper metal at pH less than about 9, can be coated with an adherent monolayer of the polymers containing active agents (see, G. A. Parks "The Isoelectric Points of Solid Oxides, Solid Hydroxides, and Aqueous Hydroxo Complex Systems" *Chem. Rev.* 65, 177–198 (1965)). It is believed that the polymers can adhere to positively charged surfaces because of their strong positive surface charges which can act to induce a localized negative charge on the surface. While the monolayer deposited on a positively charged surface is frequently incomplete, it is useful for conducting or catalyzing a reaction on the surface.

Examples of surfaces which can be deposited with at least a partial monolayer of the positively charged polymers include the surfaces of plastics, such as acrylonitrile-butadiene-styrene, imides, teflon, acrylics, and epoxies, glass and epoxy-glass laminates, metals, such as copper, nickel, iron, steel, and stainless steel, and semiconductive solids, such as silicon and gallium aresenide, and the like.

I have found that the positively charged polymer particles will adhere to surfaces over any pH range, for example, pH 1 to pH 14, although a pH of about 10–12 is preferred for electroless deposition. Weak base polymer particles form a complete monolayer at low pH's, less than pH 12, because the polymer's amine groups are protonated providing the positive surface charge which attracts the particles to negatively charged surfaces. At about pH 10, the weak base polymer (pKa about 10) is about 50 percent protonated or about one-half positively charged, and, as the pH is raised above pH 10, the weak base polymer particles become less positively charged. At about pH 12 the polymer particles are about one percent protonated, and their ability to stick to surfaces becomes significantly reduced as illustrated in Examples 6 and 7.

The cationic polymer particles become so strongly bound to surfaces that the particles cannot generally be removed simply from the surface as by vigorous rinsing with water, by the application of solvents, such as alcohols or ketones, or by the use of concentrated salt solutions, such as brine. Mild abrasion can be used, as in the case of tin-palladium catalysts, to remove the polymer particles from the surfaces, if desired.

One or several different active agents can be distributed throughout the polymers. In addition, the polymers may be separately loaded with different active agents and then mixed to form a new active system containing a mixture of two different active agents which can then be deposited simultaneously on a surface. In the case of the insoluble polymers, the mixing of active agents, which are otherwise incompatible with each other, can be combined together advantageously without undesired reactions taking place. Various combinations of single and mixed catalytic or reactive systems can be used to catalyze or conduct different reactions sequentially or simultaneously on the same or different areas of a surface according to the manner and sequence in which the positively charged polymers containing the active agents are deposited on the surface. Further, by reducing one catalytically active metal salt to pure metal before reducing another catalytically active metal salt to its pure form, or by altering the sequence of introducing the chemical reactants, various reactions can be conducted in series on the surface. Sequential chemical reactions can be conducted as by depositing one catalyst system on a surface, contacting the surface with a reactant, depositing a second catalyst system thereon, and then contacting the once-reacted surface with a second reactant. Therefore, the application of the invention for catalyzing chemical reactions on surfaces in a controlled manner, in the sense of predetermined areas and sequences, is unlimited.

The catalyst system of the present invention is particularly useful for complete electroless deposition of printed circuit board surfaces and through-hole walls because of the strong adhesion of the polymers onto these surfaces and because of the small particle sizes of the catalyst particles. The electroless deposition process of the invention proceeds by first cleaning, rinsing, and preferably etching the substrate. The etched substrate is then rinsed and immersed in the aqueous catalyst system for a time sufficient to form a monolayer on the surface. The substrate is typically moved cyclically back and forth in the bath to keep it in contact with the catalyst system and to shorten the contact time necessary to deposit a monolayer. Typically, the contact time is about 5 minutes at 25° C at a concentration of about 40 ppm catalyst metal in the catalyst dispersion (see Example 4). The catalytic polymer particles become deposited as an adherent monolayer on the substrate surface and through-hole walls. The catalyzed substrate is then placed in a rinse bath for about one minute. Any insoluble polymer particles not deposited on the substrate surface or on the through-walls are optionally recovered from the rinse bath as by ultrafiltration and returned to the catalyst system. The rinsed, catalyzed substrate is then immersed in an appropriate electroless metal bath, such as Shipley Company, Cuposit 328Q ®, for about 15 minutes with cyclic movement of the substrate as described above.

The concentration of catalytic material, for example palladium in the catalyst dispersion or catalyst bath, which is needed for effective electroless deposition has been found to be about six times lower than the concentration of palladium required in conventional tin-palladium systems.

The catalytic activity of the cationic polymer particles for electroless deposition is a function of their particle size. Decreasing the particle size diameter increases the number of particles available in the aqueous catalyst system and results in more complete coverage of the substrate and through-hole walls at a constant contact time. This coverage results in rapid catalytic initiation and thicker electroless deposits than achieved with catalyst systems employing tin stabilizers. In order to determine the maximum particle size that could be utilized effectively for electroless deposition, conventional, ground ion exchange resins having positively charged surfaces and particle size diameters ranging from less than 1 micrometer up to 10 micrometers were prepared and deposited on glass slides. The ground particles having diameters of up to about 3 micrometers were found to be capable of adhering to the surface, even after vigorous rinsing, and can be used in some applications. However, since the ground resin particles are not capable of being prepared with a very narrow particle size distribution, and with very small diameters, the practicality of their use for the deposition of an adherent, uniform and complete monolayer is limited as compared with the smaller polymer particles, prepared as described above, having a narrower particle size range and diameters on the order of about 0.1 micrometer. The inability of the larger, greater than about 3 micrometer, ground resin particles to adhere to surfaces combined with the difficulty in obtaining a sufficient number of the smaller, adherent ground polymer particles by grinding conventional resins, is detrimental to the practical utility of an aqueous catalyst system containing ground resin, especially for complete electroless deposition of printed circuit board surface and particularly the through-hole walls formed therein.

I have also found that the soluble and insoluble cationic polymers can be used as a surface conditioner prior to the use of a conventional tin-palladium catalyst system. When the cationic polymers are not loaded with an active agent, they can be deposited as an adherent monolayer on a surface. A conventional tin-palladium catalyst can then be applied to the conditioned surface and the electroless deposition coverage achieved using such an approach is improved as compared to conventional systems. The prior deposition of an adherent monolayer of the cationic polymers on the surface allows for the use of a conventional tin-palladium catalyst containing a lower level of palladium than would normally be effective to catalyze a surface, for complete electroless deposition on the surface.

The catalyst system of the present invention for electroless deposition results in fewer plating voids on the through-hole walls of printed circuit boards than conventional tin-palladium catalyst systems and eliminates the need for tin and acid accelerators used in conventional electroless deposition processes.

The complete coverage of the substrate surface and through-hole walls using the catalyst system of the invention results in a thicker electroless deposition layer, at a constant contact time in the electroless plating bath, than with conventional tin-palladium catalysts. The improvement in the deposition layer thickness is typically 25-30 percent.

Since the catalyst system of the invention strongly adheres to surfaces without the need to pre-condition the substrate, such as with a quaternary ammonium surfactant, and eliminates the need for an acceleration step to remove a protective colloid, an electroless deposition process utilizing the catalyst system of the invention results in fewer processing steps and less time than conventional electroless deposition processes.

The aqueous catalyst system is highly stable in air. When the system is exposed to air as by spraying the insoluble copolymer dispersion in a recirculating system, the system remained stable. The dispersion of the polymer particles can be completely dried in air followed by rehydration and resuspension without loss in catalytic activity. The catalyst system can be repeatedly frozen and thawed as by cycling between about 0° C and 40° C without suffering any physical changes. The catalyst system is heat stable at temperatures of about 80 to about 100° C for several weeks, depending on the pH of the dispersion.

Since the catalyst metal concentration in the dispersion can be six times, or more, lower than the levels used with conventional electroless catalyst systems, losses of the catalyst, caused by drag-out of the catalyst on the substrate after rinsing, is substantially reduced as compared to conventional electroless catalyst systems.

The following examples are intended to illustrate, and not to limit, the invention.

EXAMPLE 1:

Synthesis of Insoluble Catalyst System

An aqueous emulsion of crosslinked, strongly basic, essentially spherical, cationic copolymers having an average particle size diameter of 0.24 micrometers formed from a 97.5 weight percent styrene and 2.5 weight percent divinylbenzene pecursor emulsion and fully functionalized with benzyl trimethyl ammonium chloride was prepared according to the teachings of U.S. Pat. No. 4,359,537. "Fully functionalized" means that about one benzyl trimethyl ammonium chloride group is attached to each aromatic ring of the precursor emulsion. The pH of the aqueous emulsion was pH 7.0. One thousand grams of the emulsion was diluted with deionized water to a 5.0 weight percent solids concentration and placed in a two liter round-bottom reaction flask fitted with a paddle stirrer. With vigorous stirring, 6.67 grams of solid palladium chloride crystals were added to the flask containing the aqueous copolymer emulsion. Using a heating mantle, the temperature of the contents of the flask was raised to 85° C. The temperature was maintained at 85° C. for two hours while stirring continued. About 1.5 to 2.5 hours after the temperature was raised to 85° C., the copolymer formed an orange color and no palladium chloride settled to the bottom of the flask when the stirrer was turned off. This indicated that the loading of the palladium chloride onto the emulsion polymer was complete. The suspension was then allowed to cool to ambient temperature with constant stirring. Stirring was continued for an additional twenty two hours after the suspension reached ambient temperature.

It is believed that the palladium chloride had complexed with the quaternary ammonium chloride functional groups distributed throughout the copolymer matrix forming a tetrachloropallidate complex according to the reaction:

R—CH$_2$—N—(CH$_3$)$^+$Cl$^-$ + PdCl$_2$ ⟶

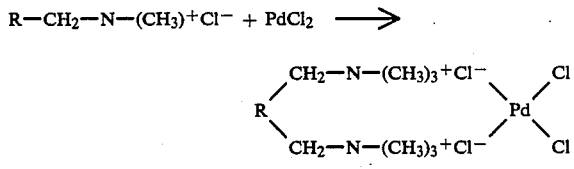

where R is the crosslinked copolymer matrix.

The palladium ions distributed throughout the copolymer matrix were then reduced to pure palladium metal by reacting the tetrachloropallidate complex with a solution of formaldehyde and sodium hydroxide. 6.10 grams of 37% formaldehyde followed by the addition 18.04 grams of 50% sodium hydroxide solution were added to the flask containing the tetrachloropallidate complex. This amount of formaldehyde and sodium hydroxide was equal to a 100 percent molar excess of the amount needed to reduce the palladium. The reducing solution stoichiometrically reduced the complexed palladium ions to palladium metal, at ambient temperature, according to the reaction:

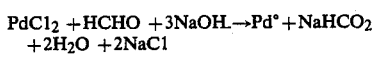

After the reduction, the polymer dispersion changed from milky white in color to greyish black. No palladium was observed to settle from the aqueous dispersion even after standing for several weeks. The same reduction reaction carried out in the absence of the polymer emulsion and using sodium chloride to solubilize the palladium chloride, produced a black precipitate which rapidly settled from the water leaving a clear supernatant. This indicates that the polymer dispersion is necessary for the formation of a stable palladium dispersion and that the reduced metal is distributed predominantly within the matrix or on the surface of the polymer particles.

The reduced copolymer dispersion at pH 7.0 was then contacted with a glass microscope slide by cyclically moving the slide in the aqueous copolymer dispersion to illustrate the deposition of the uniform, monolayer of the catalyst system on a negatively charged substrate. The glass microscope slide was examined under a Zeiss Universal (Model M) microscope at seven hundred times magnification. A photograph of the monolayer was obtained using a standard Nomarski Differential Interference Contrast technique.

FIG. 1 presents the photograph of the copolymer catalyst particles uniformly deposited on the glass slide.

EXAMPLE 2

Synthesis of Soluble Polymer Catalyst Systems

Two soluble polymers containing quaternary ammonium chloride functionalities were synthesized and catalytically loaded as described in Example 1. The soluble polymers used were a dimethylaminoethylmethacrylate (DMAEMA) polymer quaternized with epichlorohydrin (Polymer A) and a DMAEMA polymer quarternized with ethylene oxide (Polymer B).

The two soluble polymers were then diluted with deionized water to a 10 percent by weight solids content. To place the soluble quaternary functionality in the chloride ion form, the polymer solutions were passed through a column of Rohm and Haas Company IRA-400 ion exchange resin (chloride ion form) at a rate of 0.5 gal/ft.$^3$/min. One thousand grams of the 10% solution in the chloride ion form were then placed in a 1500 ml Erhlenmeyer flask. A magnetic stirrer was placed in the flask. With rapid stirring of the solution, 10 grams of solid palladium chloride crystals were added to the flask. Using a hot plate, the temperature of the solution was raised to 85° C for two hours while stirring. After one half to about one hour, all solid palladium chloride had become associated with the soluble polymer as indicated by the absence of palladium solid when stirring was stopped. After the two hour heating period, the solution was allowed to cool to room temperature for an additional two hour period with constant stirring.

The palladium ion associated with the soluble copolymers was reduced to palladium metal by adding a 100 percent molar excess of formaldehyde (9.2 grams of 37% solution of formaldehyde in water) followed by stirring for 10 minutes. 27.0 grams of 50% sodium hydroxide (100% molar excess) was then added. No gas evolution was evident. The pH of the solution was then adjusted to about pH 12, and the solution was stirred for an additional hour. The soluble polymer catalyst systems were black in color and remained stable in solution without palladium precipitation. The soluble catalyst systems visibly appeared to be aqueous dispersions as in the case of the insoluble copolymer catalyst system. The soluble catalyst systems had a palladium metal loading of 60 milligrams palladium metal per gram of polymer solids.

EXAMPLE 3

This example was conducted to determine the maximum size of a positively charged polymer which will adhere to surfaces.

Figure 2:
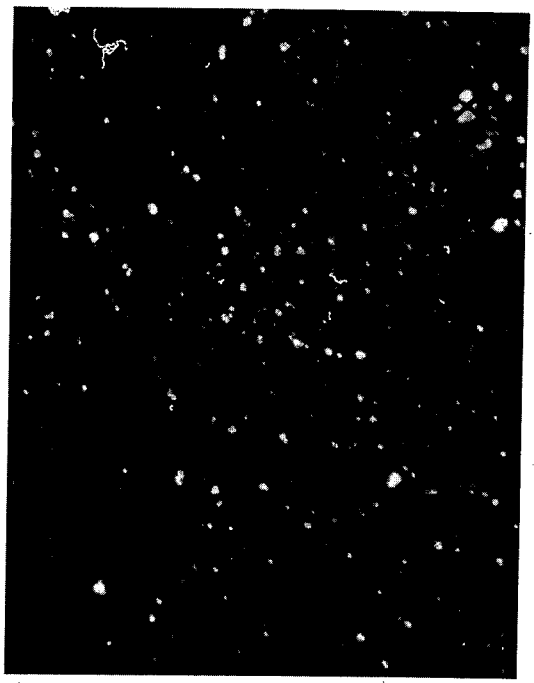
FIG. 2 is a photograph of a glass microscope slide having been contacted with ground, conventional size ion exchange resins magnified seven hundred times.
Figure 5:
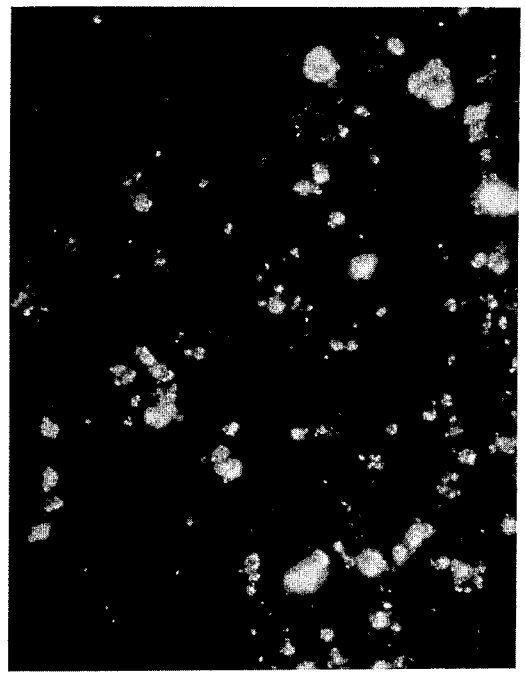
FIG. 5 is a Normarski Differential Interference Contrast photograph of a suspension of ground Amberlite ® IRA-400 ion exchange resin in water, following settling for one minute, magnified seven hundred times.

A ground, conventional ion exchange gel type resin, Rohm and Haas Company IRA-400 (styrene-divinyl benzene), having quaternary ammonium functionality, and distribution of particle sizes of 10 micrometers down to less than 1 micrometer, was suspended in deionized water and allowed to settle for 1 minute. FIG. 5 illustrates the particle size and distribution of the ground resin in suspension after settling for one minute. The aqueous suspension was contacted with a vertically positioned glass microscope slide for 5 minutes followed by a vigorous rinsing with deionized water. FIG. 2 illustrates the non-uniformity of the deposited suspension on the slide, magnified seven hundred times. FIG. 2 clearly shows that polymers having particle sizes of about 3 micrometers or less on the slide adhered to the slides; however, the presence of voids on the surface was pronounced. This example illustrates that while ground, conventional size, ion exchange resins having positive surface charges are useful, they are not preferred in the practice of the present invention

EXAMPLE 4

Electroless Deposition of Copper

The catalyst system synthesized in Example 1 was diluted 100 times with deionized water and pH adjusted to 12.0 using sodium hydroxide to yield a catalyst bath concentration of 40 parts per million palladium. The diluted suspension was then utilized at a temperature of 25° C. even though it is stable and active at a temperature of up to about 85° C. A sulfuric acid etched, glass-epoxy type FR-4 printed circuit board substrate containing a fire retardant was immersed in the dilute catalyst suspension for 5 minutes while maintaining a slow back and forth motion of the substrate in the catalyst suspension utilizing a motorized conveyor. At the end of the 5 minute period, the substrate was placed in a rinse bath of water for one minute and then in a copper electroless deposition solution manufactured by Shipley Company under the trademark Cuposit 328Q ® for 15 minutes. The electrolessly deposited substrate was then visually examined using a microscope for coverage of the substrate surface (flats) and edges. The flat coverage was reported on a percentage of the area covered while the edge coverage was reported as being either: 1 —complete; 2 —few very small voids; 3 —a few larger voids; or 4 —gross voids. An edge coverage rated 1 or 2 is acceptable, while an edge coverage of 3 or 4 is not acceptable. The average thickness of the copper layer deposited on the substrate surface was determined to the nearest millionth of an inch using an average of four readings from a Beta-Backscatter instrument. The Beta-Backscatter instrument utilized was a Compuderm-B Model MP-8 electronic, non-destructive coating thickness gauge. The Compuderm uses Beta-rays, reflected from the surface of the object being measured to determine coating thickness. The rays are emitted from a radioactive source on the probe. The reflected Beta-rays bounce into the window of a Geiger tube in the probe which converts the rays into electrical impulses and transmits these impulses to an internal processor which counts the impulses received during a preset time interval and computes a direct digital readout of the coating thickness. As the thickness of the coating increases, more rays are reflected while the rays reflected from the base material decreases. Knowing the number of Beta-rays reflected from the base material, the thickness of the coating is determined to the nearest millionth of an inch.

For comparison, a conventional tin-palladium catalyst system, Shipley Company Cataposit 44 ® containing about 240 parts per million palladium metal, was also deposited onto the same substrate material and subjected to the conventional electroless deposition process utilized with such a catalyst system.

The results of the electroless deposition achieved on the substrates utilizing the two catalyst systems is illustrated in Table I.

TABLE I

Electroless Deposition of Copper on Printed Circuit Board

| Catalyst | Bath Conc. ppm Pd* | Coverage Flats Rating % | Coverage Edges Rating 1-4 | Average Copper Thickness Millionth of Inch |
|---|---|---|---|---|
| Insoluble Cationic Copolymer CS* | 40 | 100 | 2 | 24 |
| Shipley Cataposit 44 ® | about 240 | 100 | 2 | 19 |

*CS = Catalyst System

Both catalyst systems provided complete substrate surface coverage and acceptable edge covering. The thickness of the copper layer deposited after using the catalyst system of the present invention was about 25% greater than the thickness achieved with a commercial, conventional catalyst system containing six times the amount of palladium metal than the catalyst system of the present invention.

EXAMPLE 5

Electroless Deposition using Soluble Polymer Catalyst Systems

Both soluble polymer systems synthesized, loaded with palladium and reduced to form a catalyst system containing 60 milligrams palladium metal per gram of polymer solids, as described in Example 2, were evaluated for their ability to initiate electroless deposition of copper on a FR-4 substrate.

A FR-4 substrate was immersed in both of the undiluted catalyst systems (10% solids, 6000 ppm palladium) for minutes at 25° C with agitation by the slow back and forth motion of the substrate in the catalyst system. At the end of the 5 minute period, each substrate was placed in a rinse bath of deionized water at 25° C. with agitation and then in a copper electroless solution (Cuposit 328Q) at 25° C. for 15 minutes. The electrolessly deposited substrates were then examined using a microscope for the extent of coverage and the average thickness of the deposited copper layer on the substrate was determined as described in Example 4. The results of this evaluation are presented in Table II.

TABLE II

Electroless Deposition of Copper Using Soluble Polymer Catalysts

| Catalyst[1] | pH | Coverage Flats Rating % | Coverage Edges Rating 1-4 | Average Copper Thickness Millionth of Inch |
|---|---|---|---|---|
| Polymer A | 11.8 | 100 | 1 | 14 |
| Polymer B | 11.5 | 100 | 1 | 11 |

[1] Polymer A and B are described in Example 2. Each catalyst system contained 6000 ppm Pd.

EXAMPLE 6

Surface Adhesion Caused by Polymer Surface Charge

To determine that the adhesion of the catalyst systems of the present invention is due to the positive surface charge of the cationic polymers, a series of strong base, weak base, strong acid, and weak acid, essentially spherical, submicron size crosslinked emulsion copolymers at about a 5% solids concentration in water were prepared according to U.S. Pat. No. 4,359,537. Each was deposited on a clean glass microscope slide. The slides were first cleaned in a 50/50 mixture of sulfuric acid and an aqueous solution containing 30% by weight hydrogen peroxide and dried at 50° C. in air for one hour prior to deposition. The clean, dry slides were then immersed separately for 5 minutes, without any agitation, in each of the insoluble copolymer suspensions. The slides were then removed from the suspensions and rinsed thoroughly by running deionized water over the slides for 2 minutes. The slides were then dried at 50° C in air and examined at seven hundred times magnification on a Zeiss Universal microscope and the NDIC technique.

Table III illustrates the results of this test. The positively charged (cationic) resins stuck to the glass while the negatively charged (anionic) resins did not.

Furthermore, the pH of the insoluble weak base resin was adjusted from pH 2 to pH 12 to determine the effect of protonating the weak base resin on its ability to adhere to the negatively charged glass surface. Below pH 10 the weak base resin provided a complete monolayer on the surface, but at pH 12 the adhesion had decreased to the point where a complete monolayer was not deposited.

TABLE III

Substrate Coverage as a Function of copolymer Surface Charge

| Insoluble Copolymer Type | Insoluble Copolymer Composition | Functional Polymer Group | Charge | Suspension pH | Surface Coverage |
|---|---|---|---|---|---|
| Strong acid | Styrene/DVB | Sulfonate | Neg. | 1.8 | None |
| Weak acid | Methylacrylate | Carboxylic | Neg. | 10.7 | None |
| Strong base (chloride) | Styrene/DBV | Quaternary Ammonium | Pos. | 1-13 | Complete Monolayer |
| Strong base (dithionite) | Styrene/DVB | Quaternary Ammonium | Pos. | 4.1 | Complete Monolayer |
| Weak base | Styrene/DVB | Tertiary Amine | Pos. | 6.2 | Complete Monolayer |
| Weak base | DMAEMA/DVB | Tertiary Amine | Pos. | 2.0 | Complete Monolayer |
| Weak base | DMAEMA/DVB | Tertiary Amine | Pos.* | 8.0 | Complete Monolayer |
| Weak base | DMAEMA/DVB | Tertiary Amine | Pos.* | 12.0 | Incomplete Layer |

*=Decreasingly positive

EXAMPLE 7

Effect of PH on Electroless Deposition Using Insoluble Weak Base Catalyst System An insoluble weak base catalyst dispersion of DMAEMA/styrene/DVB catalytically loaded as described in Example 1 was progressively protonated with extreme pH to determine the ability of the catalyst system for electroless copper deposition on a substrate according to the procedure set forth in Example 4. The results of this test are presented in Table IV.

TABLE IV
Effect of PH on Weak Base Catalyst

| Catalyst | Catalyst Bath Pd Concen. ppm | pH | Coverage[2] Flat, % | Edges, 1–4 |
|---|---|---|---|---|
| DMAEMA/styrene/DVB[1] | 400 | 12.0 | 20 | 3 |
| " | 400 | 1.0 | 99 | 1 |
| " | 200 | 12.0 | 20 | 3 |
| " | 200 | 1.0 | 100 | 1 |
| " | 40 | 12.0 | 0 | 4 |
| " | 40 | 1.0 | 99 | 1 |

[1]DMAEMA/DVB is a copolymer formed from 60 weight percent dimethylaminoethylmethacrylate (DMAEMA) 35 weight percent styrene and 5 weight percent divinyl benzene (DVB) crosslinking agent.
[2]Using Shipley Company Cuposit 328Q ®.

The weak base copolymer was still partially protonated at pH of about 12 and therefore was able, to a very small extent, to adhere to the surface. At pH 1.0 the weak base resin provided almost complete coverage of the substrate and edges even at a 40 ppm palladium loading.

EXAMPLE 8

Effect of Particle Size

Three strong base, insoluble copolymers formed from 60.0 weight percent DMAEMA, 37.5 weight percent styrene, and 2.5% DVB at a 5% solids concentration and loaded with 120 milligrams of reduced palladium metal per gram of dry copolymer resulting in a dispersion containing about 6000 ppm palladium were prepared. The only difference between the three copolymers was their average particle size diameters. The copolymers had average particle size diameters ranging from a high of 0.33 micrometers to a low of 0.13 micrometers. These copolymer catalyst systems were then tested for their ability to produce uniform, complete electroless copper deposition on an etched, FR-4 epoxyglass substrate. The concentration of the palladium metal in each of the catalyst systems was sequentially diluted down from 6000 ppm to 2.5 ppm to determine the catalytic activity of the catalyst system as a function of the particle size of the copolymer and the concentration of palladium in the catalytic dispersion. The pH of each catalyst suspension was adjusted to pH 12 and the glassepoxy substrate was immersed in various dilutions of each catalyst system for 5 minutes, with agitation, at 25° C, rinsed in deionized water for 1 minute, immersed in Shipley Company Cuposit 328Q ® electroless copper solution for 15 minutes, rinsed and dried. The dried substrates were then examined for copper coverage and thickness as described above. The results of this test are illustrated in Table V.

TABLE V

| Catalyst System Average Particle Size (Micrometers) | Approximate Pd Concentration in Catalyst Bath PPM | Electroless Copper Coverage Flats, % | Electroless Copper Coverage Edges (1–4) | Average Copper Thickness Millionth of Inch |
|---|---|---|---|---|
| 0.33 | 60 | 100 | 1 | 11 |
| 0.16 | 60 | 100 | 1–[1] | 14 |
| 0.13 | 60 | 100 | 2 | 15 |
| 0.33 | 30 | 100 | 2 | 8 |
| 0.16 | 30 | 100 | 2 | 10 |
| 0.13 | 30 | 100 | 2 | 12 |
| 0.33 | 15 | 100 | 3 | 3 |
| 0.16 | 15 | 100 | 1 | 9 |
| 0.13 | 15 | 100 | 2 | 12 |
| 0.33 | 10 | 10 | 3 | 0.5 |
| 0.16 | 10 | 100 | 2 | 6 |
| 0.13 | 10 | 100 | 1– | 7 |
| 0.33 | 5 | 0 | 4 | 0 |
| 0.16 | 5 | 85 | 2 | 4 |
| 0.13 | 5 | 100 | 2 | 6 |
| 0.33 | 2.5 | 0 | 4 | 0 |
| 0.16 | 2.5 | 0 | 4 | 0 |
| 0.13 | 2.5 | * | 4 | 0 |

[1]1– rating is poorer tahn a 1 rating and better than a 2 rating and is acceptable.
*Trace Table V shows a correlation between smaller particle size and greater catalytic activity. The edge coverage obtained with the larger particle size copolymer began to become unacceptable, although the flat coverage remained complete, when the palladium loading was reduced to about 15 ppm. The average copper thickness of the electroless layer was always greater for the smallest particle size copolymer and was 6 millionths of an inch thick with an acceptable edge coverage and complete flat coverage even at a palladium loading of 5 ppm. The greater number of particles available in the smaller particle size suspensions apparently results in a more complete coverage of the substrate, at a constant contact time, than the larger particle suspensions resulting in faster initiation and thicker copper deposits.

The conventional, ground, positively charged, ion exchange resins, described in Example 3 were only capable of adhering to glass when their particle sizes were less than about 3 micrometers. Accordingly, in the practice of the present invention, the particle sizes of the essentially spherical polymer particles should be less than 1 micrometer, prefererably less than 0.5 micrometer, and most preferably as small as 0.13 micrometer.

EXAMPLE 9

Through-Hole Deposition

Figure 3:
FIG. 3 is a PTH Backlight Transmission photograph of a sectioned through-hole wall containing an electroless deposition layer formed according to the process of the invention.
Figure 4:
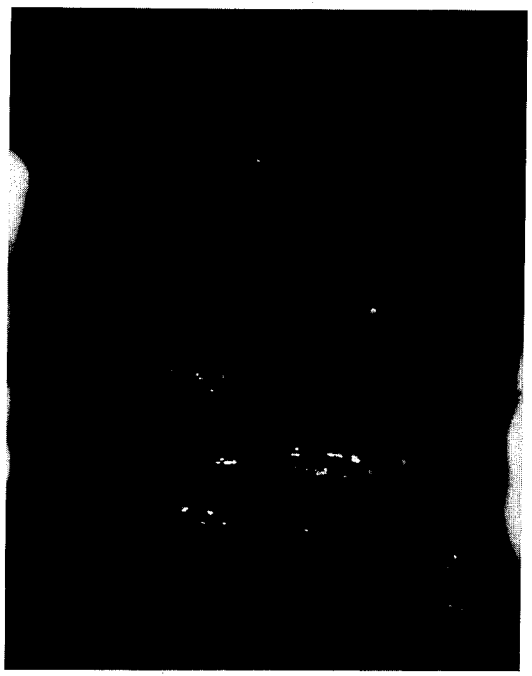
FIG. 4 is a PTH Backlight Transmission photograph of a sectioned through-hole wall containing an electroless deposition layer formed using a conventional electroless deposition process.

PTH Backlight transmission photographs (FIGS. 3 and 4) were taken of printed circuit board containing numerous through-holes. The Backlight transmission test involved microscopic examination of the electroless deposition in the through holes of printed circuit boards. After the board was electrolessly plated, it was sectioned using a diamond saw. A thin strip was prepared by cutting just behind a row of holes and then directly through the holes. The thin slice was mounted in a jig and viewed under the microscope while shining light through the section from below. In this manner, the voids and thin deposits on the hole walls were visibly apparent. After electroless copper deposition using the insoluble, cationic copolymer catalytic dispersion of the present invention and a conventional tin-palladium catalyst system (Shipley Cataposit 44 ®), the coverage of the through-hole walls achieved with the catalyst system of the present invention was found to be clearly superior to the coverge achieved with the conventional system. White specks on the photograph indicate areas where no electroless copper was present.

Example 10

Cationic Copolymers as Catalyst Conditioner

This example illustrates the effectiveness of the insoluble polymer particles described above as a surface conditioner for use in an electroless deposition process prior to the application of a conventional tin-palladium catalyst system. The polymers which had not been loaded with an active agent were first applied to the FR-4 printed circuit board substrate for 15 minutes at 5% solids content. Following this step, the following conventional electroless deposition process, using progressively diluted catalyst baths, was used:

Shipley Cataprep ® 404 —1 minute at 25° C.;
Shipley Cataposit ® 44 —5 minutes at 25° C.;
Rinse —1 minute with deionized water;
Accelerator 240 —5 minutes at 38° C.;
Rinse —1 minute with deionized water;
Plate with Shipley 328Q ®—15 minutes at 25° C.;
Rinse with deionized water and dry.

The results of the use of the insoluble polymer particles as a conventional electroless deposition catalyst conditioner are shown in Table VI.

EXAMPLE 11

Chemical Reaction on Surface

This example demonstrates the ability of the present invention to carry out a chemical reaction at a surface.

An insoluble polymer containing a chemically reactive moiety was synthesized as follows. A macroreticular copolymer of styrene and about six percent by weight divinylbenzene was prepared by conventional suspension polymerization techniques. The copolymer was sequentially reacted with chloromethylether and dimethylamine to form a weakly basic resin containing benzyldimethylamine functional groups. A borane-amine adduct was then distributed throughout the resin by an anhydrous reaction with tetrahydrofurane:borane reagent thereby creating a reductive resin. The reductive resin was then ground in a Cresent Wig-1-bug ® laboratory pulverizer for 10 minutes and 0.8 grams of the ground resin was added to 100 milliliters of deionized water and the pH was adjusted to 10 with sodium hydroxide to form a stable aqueous dispersion. The particle size of the ground, powdered resin was sufficiently small (average diameter approximately less than 3 microns) such that a large fraction of the ground resin did not settle during the course of the subsequent experiment and was capable of providing a complete, adherent monolayer on the surface of glass slides immersed in the aqueous dispersion of the resin for a few minutes.

The aqueous dispersion containing the white colored reductive resin rapidly turned black in color upon its introduction into an aqueous solution containing 5 weight percent sodium chloride and 1 weight percent palladium chloride. The black color was due to the dispersed palladium metal and indicated that the reductive resin was active for reducing the palladium ions to palladium metal.

A panel of FR-4 type printed circuit board substrate prepared as described in Example 4, was then immersed in the active aqueous dispersion for 5 minutes at 25° C. with gentle agitation to deposit a monolayer of reactive resin on the FR-4 surface. Following a one minute rinse with deionized water at 25° C., the panel was then immersed for 5 minutes with agitation at 25° C. in an aqueous solution containing 5 weight percent sodium chloride and one weight percent palladium chloride to reduce palladium ions to palladium metal at the surface. The FR-4 panel was then rinsed in a 20 weight percent

TABLE VI

POLYMER PARTICLES AS CONVENTIONAL CATALYST CONDITIONER

| Sample | Concentration of Pd in Cataposit 44 Catalyst Bath, ppm | Conditioner Type | Coverage Flats Percent | Coverage Edges 1-4 | Thickness of Copper Coverage Millionths of Inch |
|---|---|---|---|---|---|
| A | 7.2 | None | 75 | 4 | — |
| B | 7.2 | (DMAEMA/DVB) | 100 | 3 | — |
| C | 7.2 | (Styrene/DVB) | 100 | 3 | — |
| D | 4.8 | None | 0 | 4 | 0 |
| E | 4.8 | (DMAEMA/DVB) | 100 | 4 | 12 |
| F | 4.8 | (Styrene/DVB) | 100 | 4 | 14 |
| G | 2.4 | None | 0 | 4 | 0 |
| H | 2.4 | (DMAEMA/DVB) | 100 | 4 | 11 |
| I | 2.4 | (Styrene/DVB) | 100 | 4 | 16 |
| J | 1.2 | None | 0 | 4 | 0 |
| K | 1.2 | (DMAEMA/DVB) | 0 | 4 | 0 |
| L | 1.2 | (Styrene/DVB) | 0 | 4 | 0 | aqueous sodium chloride solution for 15 minutes at 25° C. to remove any unreduced palladium.

The presence of reduced palladium on the surface of the panel was demonstrated by introducing the panel into an electroless copper plating bath (Shipley Co. Cuposit 328Q) for 15 minutes. The panel (flats and edges) were found to be completely covered with a copper layer 8.8 millionths of an inch thick as measured by the Beta Backscatter technique.

An identical experimental sequence was conducted using the insoluble polymer containing benzyl trimethylammonium chloride functional groups as described in Example 1, without an active reducing agent distributed throughout, in place of the reductive resin described above. In this experiment, however, no plating of the panel occurred when subjected to the electroless copper bath indicating that unreduced palladium cannot be responsible for the plating that occurred using the reactive, reductive resin. This example demonstrates that the distribution of an active agent such as an amine borane moiety in a positively charged polymer is useful for reducing palladium ion to palladium metal at a printed circuit board surface.

What is claimed is:

1. An electroless metal deposition process for printed circuit board surfaces and through-hole walls comprising:
    (a) catalyzing a clean printed circuit board surface and through-hole wall surfaces formed in said board by depositing an adherent monolayer of positively charged polymer particles having particle size diameters less than about 3 micrometers and containing one or more catalytically active agents distributed throughout said particles and where said positively charged particles containing said catalytically active agents are dispersed in water forming a stable colloidal dispersion; and
    (b) contacting said catalyzed surfaces with a bath containing an electroless metal to deposit an electroless metal layer on said surfaces.

2. The process of claim 1 where said catalytically active agents are pure metals selected from the group of platinum group metals and mixtures thereof.

3. The process of Claim 1 where said catalytically active agent is a reducing agent capable of initiating electroless deposition.

4. The process of claim 2 where said catalytically active agent is palladium.

5. The process of claim 3 where said stable colloidal dispersion has a pH ranging from about 1 to about 14.

6. The process of claim 1 where the particles which are not deposited as an adherent monolayer on the surface are recovered from the rinse bath following the catalyzation of the surface by ultrafiltration.

7. The process of claim 1 where said polymers are insoluble in water and are formed by polymerizing a major amount of monoethylenically unsaturated monomers and mixtures thereof with minor amounts of polyethylenically unsaturated crosslinking monomers and mixtures thereof, and where said polymers are functionalized with sufficient strong or weak base to provide said polymers with positive surface charges.

8. The process of claim 7 where said aqueous, insoluble polymers are formed from monomers comprising styrene monomer and crosslinked with divinyl benzene monomer and where said copolymer is functionalized with a strong base.

9. The process of claim 7 where said aqueous, insoluble polymers are formed from monomers comprising dimethylaminoethyl-methacrylate crosslinked with divinyl benzene and quaternized forming a strong base.

10. The process of claim 1 where said electroless metal is selected from the group consisting of copper and nickel.

11. The printed circuit board prepared according to the process of claim 1.

12. The process of claim 1 where the electroless metal layer deposited on said surfaces is thicker than the metal layer deposited by conventional electroless deposition processes using the same concentration of catalyst and at a constant contact time.

13. The process of claim 1 where the aqueous catalyst system containing said pure metal catalyst is formed with a controlled quantity of said catalytic metal relative to the unit area of the surface on which it is to be deposited.

* * * * *